US011462382B2

(12) United States Patent
Wen et al.

(10) Patent No.: US 11,462,382 B2
(45) Date of Patent: Oct. 4, 2022

(54) ION IMPLANT APPARATUS AND METHOD OF CONTROLLING THE ION IMPLANT APPARATUS

(71) Applicant: NANYA TECHNOLOGY CORPORATION, New Taipei (TW)

(72) Inventors: Hsun-Po Wen, New Taipei (TW); Sung-Hui Chen, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/185,085

(22) Filed: Feb. 25, 2021

(65) Prior Publication Data

US 2022/0270846 A1    Aug. 25, 2022

(51) Int. Cl.
*H01J 37/24*     (2006.01)
*H01J 37/317*    (2006.01)
*H01J 37/05*     (2006.01)
*H01J 37/20*     (2006.01)
*H01J 37/14*     (2006.01)

(52) U.S. Cl.
CPC .............. *H01J 37/24* (2013.01); *H01J 37/05* (2013.01); *H01J 37/14* (2013.01); *H01J 37/20* (2013.01); *H01J 37/3171* (2013.01); *H01J 2237/057* (2013.01); *H01J 2237/24564* (2013.01); *H01J 2237/30472* (2013.01)

(58) Field of Classification Search
CPC .. H01J 37/24; H01J 37/05; H01J 37/14; H01J 37/20; H01J 37/3171; H01J 2237/057; H01J 2237/24564; H01J 2237/30472
USPC .......................................... 250/492.1–492.3
See application file for complete search history.

(56) References Cited

U.S. PATENT DOCUMENTS

| | | | |
|---|---|---|---|
| 2012/0175518 A1* | 7/2012 | Godet | H01J 37/244 250/492.21 |
| 2015/0228446 A1* | 8/2015 | Breymesser | H01L 29/861 250/398 |
| 2015/0325405 A1* | 11/2015 | Allen | G21K 5/08 250/491.1 |
| 2016/0024646 A1* | 1/2016 | Memering | C23C 14/48 427/523 |
| 2020/0303266 A1* | 9/2020 | Jeong | G06N 3/006 |

* cited by examiner

*Primary Examiner* — Michael Maskell
(74) *Attorney, Agent, or Firm* — Muncy, Geissler, Olds & Lowe, P.C.

(57) ABSTRACT

The present disclosure provides a substrate-processing apparatus. The substrate-processing apparatus includes an ion implanter and a controller associated with the ion implanter. The ion implanter is configured to implant ions into a substrate using an ion beam. The controller is configured to monitor an initial implantation profile of the ion beam and tune the ion implanter to provide the ion beam having a desired implantation profile based on the initial implantation profile and the desired implantation profile.

14 Claims, 9 Drawing Sheets

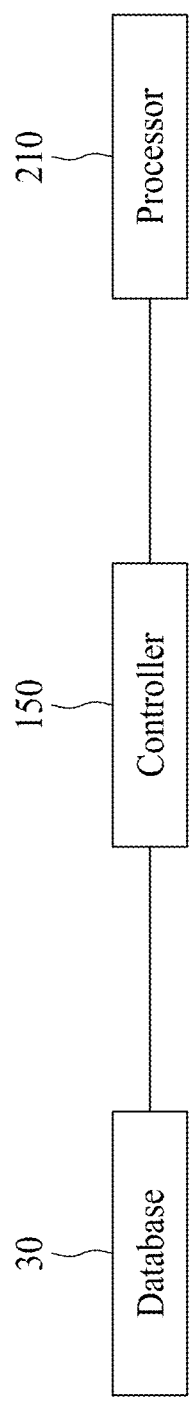

ION IMPLANT APPARATUS AND METHOD OF CONTROLLING THE ION IMPLANT APPARATUS

TECHNICAL FIELD

The present disclosure relates to a substrate-processing apparatus and a method of controlling the substrate-processing apparatus, and more particularly, to an ion implanter and a method of controlling the ion implanter.

DISCUSSION OF THE BACKGROUND

Ion beam implanters are used to implant silicon wafers with impurities to produce n-type or p-type extrinsic materials. The n-type and p-type extrinsic materials are utilized in the production of semiconductor integrated circuits. The ion beam implanter dopes the silicon wafers with a selected ion species to produce the desired extrinsic material. Implanting ions generated from source materials such as antimony, arsenic or phosphorus results in n-type extrinsic material wafers. If p-type extrinsic material wafers are desired, ions generated with source materials such as boron, gallium or indium will be implanted.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a substrate-processing apparatus. The substrate-processing apparatus includes an ion implanter and a controller associated with the ion implanter. The ion implanter is configured to implant an ion beam into a substrate. The processor is configured to monitor an initial implantation profile of the ion beam and automatically tune the ion implanter to provide the ion beam having a desired implantation profile based on the initial implantation profile and the desired implantation profile.

In some embodiments, a plurality of implantation parameters for generating the ion beam having the initial implantation profile is manually created.

In some embodiments, the processor is further configured to build a model script corresponding to the desired implantation profile.

In some embodiments, the substrate-processing apparatus further includes a database associated with the processor and employed to store the model scripts.

In some embodiments, the processor is associated with the ion implanter through a hard-wire connection or a wireless coupling.

In some embodiments, the processor is further configured to determine whether a match exists between the desired implantation profile and at least one model script and tune the ion implanter in accordance with the model script matching the desired implantation profile.

In some embodiments, the processor derives the initial implantation profile based on properties measured by a setup detector, a beam profiler and an incident angle detector of the ion implanter.

In some embodiments, the ion implanter includes an ion source energized by the processor and functioning to ionize a gas, a source manipulator extracting ions generated within the ion source to form an ion beam, a mass analyzer providing a magnetic field to select ions of desired species for implantation; a beam manipulator accepting the ion beam leaving the mass analyzer and used to manipulate a shape of the ion beam by a magnetic field, and a multipole unit and upper/lower rods to direct desired ions to the substrate using electricity. The processor tunes the ion implanter to generate the ion beam by adjusting at least one of, a potential applied to the ion source, the multipole unit is and the upper/lower rods and the magnetic field of the mass analyzer and the beam manipulator.

In some embodiments, the mass analyzer further comprises a resolving aperture to filter unwanted species.

In some embodiments, the initial implantation profile and the desired implantation profile comprise at least one of a beam current of the ion beam leaving the resolving aperture, an implanting current and an incident angle of the ion beam near an implant plane that supports a substrate.

In some embodiments, the beam current is detected by the setup detector, the implanting current is tracked by the beam profiler and the incident angle of the ion beam is scanned by the incident angle detector.

Another aspect of the present disclosure provides a method of tuning an ion beam in an ion implanter. The method includes steps of obtaining an initial implantation profile of the ion beam generated using an initial script; automatically generating an updated script based on the initial implantation profile and the desired implantation profile if the initial implantation profile does not match with a desired implantation profile; determining whether an adjusted implantation profile of the ion beam generated using the adjusted script matches with the desired implantation profile; and performing an implantation process to implant ion to a substrate if the adjusted script matches with the desired implantation profile.

In some embodiments, the method further includes a step of building a model script corresponding to the desired implantation profile.

In some embodiments, the initial script for generating the ion beam having the initial implantation profile is manually created.

In some embodiments, implantation parameters for generating the ion beam having the initial implantation profile are manually input.

In some embodiments, the ion beam having the desired implantation profile is provided by executing the initial model script.

With the above-mentioned configurations of the ion implanter, the ion beam can be automatically tuned based on the initial implantation profile and a plurality of model scripts, and additional scripts can be automatically built, so as to increase the accuracy of implantation.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended to claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

FIGS. 5A to 5D are circuit block diagrams of the ion implant device in accordance with some embodiments of the present disclosure.

DETAILED DESCRIPTION

Figure 1:
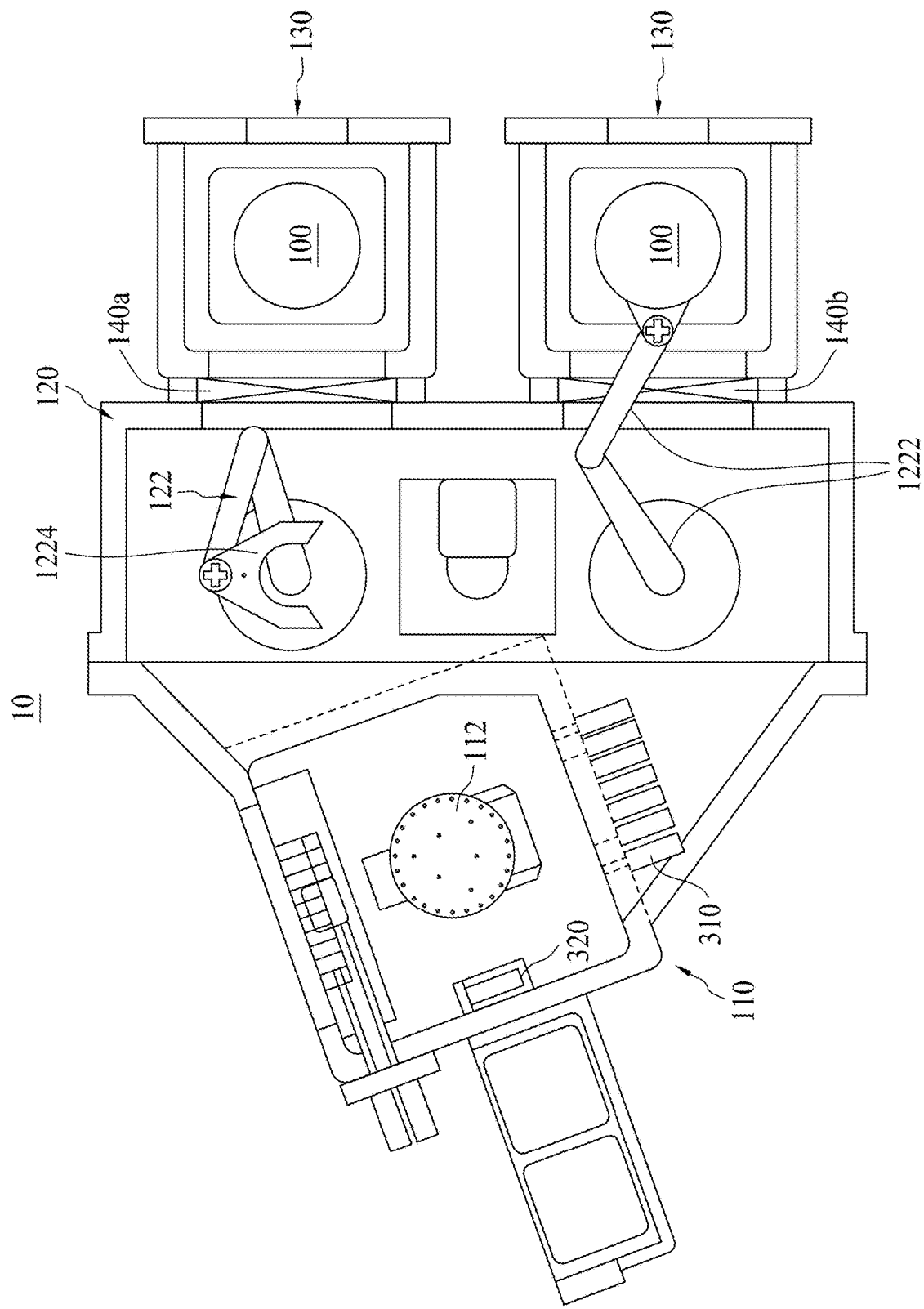
FIG. 1 is a schematic diagram of a substrate-processing apparatus in accordance with some embodiments of the present disclosure.

Embodiments, or examples, of the disclosure illustrated in the drawings are described below using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a plan view of a substrate-processing apparatus 10 in accordance with some embodiments of the present disclosure. Referring to FIG. 1, the substrate-processing apparatus 10, for processing semiconductor substrates 100, such as silicon wafers, includes at least one processing chamber 110, in which the substrates 100 are processed; a transfer chamber 120, through which the substrates 100 are moved before and after processing in the processing chamber 110; and one or more input/output chambers 130 that store the substrates 100 before and after the substrates 100 are moved through the transfer chamber 120.

The transfer chamber 120 includes at least one handler 122 adapted to pick up, transfer, and deliver substrates 100 among the processing chamber 110 and the input/output chambers 130. The handler 122 can have a plurality of arms 1222 interconnected with each other to permit a substrate retainer 1224 to move radially for picking up and depositing the substrates 100 while maintaining a desired angular orientation of the substrates 100.

The substrate-processing apparatus 10 further includes a plurality of gate valves 140a and 140b, which are configured to isolate the input/output chambers 130 from the transfer chamber 120 and the processing chamber 110. The gate valves 140a and 140b can be opened or closed. When the gate valves 140a and 140b are in the closed position, the gate valves 140a and 140b seal the input/output chambers 130, so that the input/output chambers 130 are hermetically isolated from the transfer chamber 120. When the gate valves 140a and 140b are in the open position, the gate valves 140a and 140b allow the handler 122 to load and unload the substrates 100 placed in the processing chamber 110 and the input/output chambers 130. Each of the gate valves 140a and 140b is open only when a substrate 100 passes through the gate valve 140a and 140b and closed at all other times.

The substrates 100 to be processed ("untreated substrates") that are stored in one of the input/output chambers 130 can be transferred to the processing chamber 110 by the handler 122, which operates in coordination with the open and close operations of the gate valve 140a. After undergoing one or more treatments, the treated substrates 100 can be transferred from the processing chamber 110 to another input/output chamber 130 by the handler 122, which operates in coordination with the open and close operations of the gate valve 140b.

Figure 2:
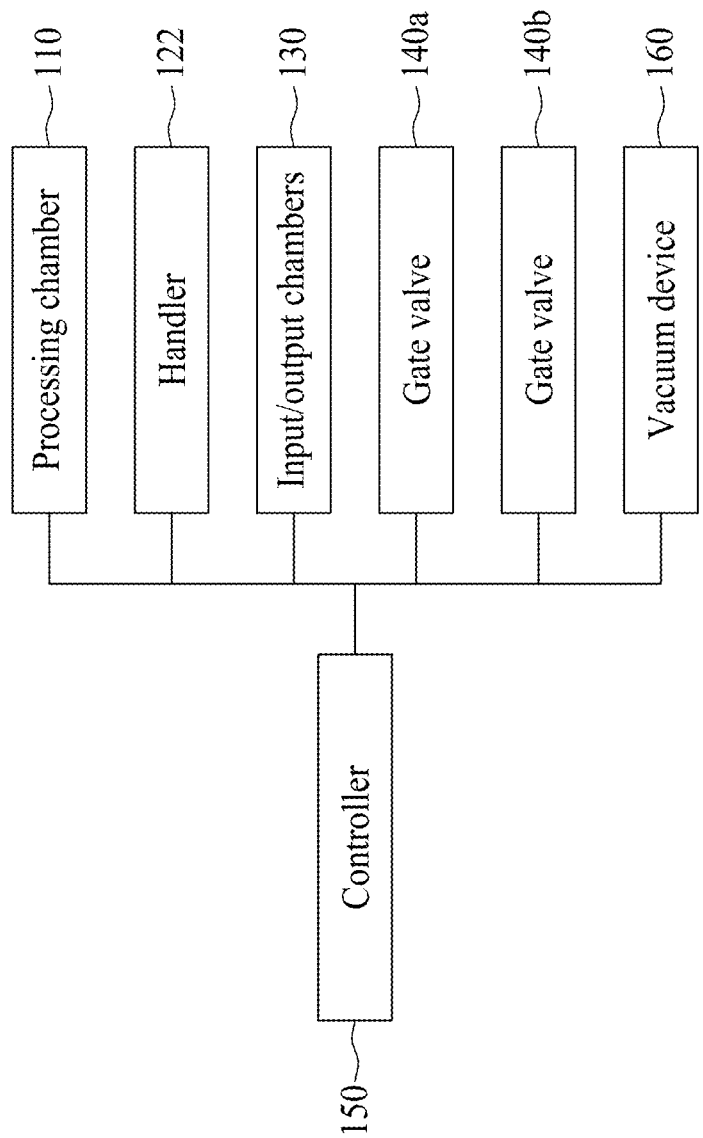
FIG. 2 is circuit block diagram of the substrate-processing apparatus in accordance with some embodiments of the present disclosure.

The complete operation of conveying the substrates 100 can be controlled by a controller 150, which is electrically connected to the handler 122 and the gate valves 140a and 140b, as shown in FIG. 2. Referring to FIG. 2, the controller 150 can control some or all of the operations of the substrate-processing apparatus 10. More particularly, the controller 150 can determine whether to open or close each of the gate valves 140a and 140b, in accordance with a conveyance path of the handler 122. In addition, the various treatments at the processing chamber 110 can be controlled by modifying the program of the controller 150. That is, the treatment can be affected at the processing chamber 110 in accordance with a modified treatment sequence. For example, the controller 150 may execute machine-readable control instructions to control the chamber pressure, chamber temperature, process timing, and other parameters of a particular process performed in the processing chamber 110. The processing chamber 110 is evacuated to at least one predetermined pressure by at least one vacuum device 160 electrically coupled to the major controller 150.

Figure 3:
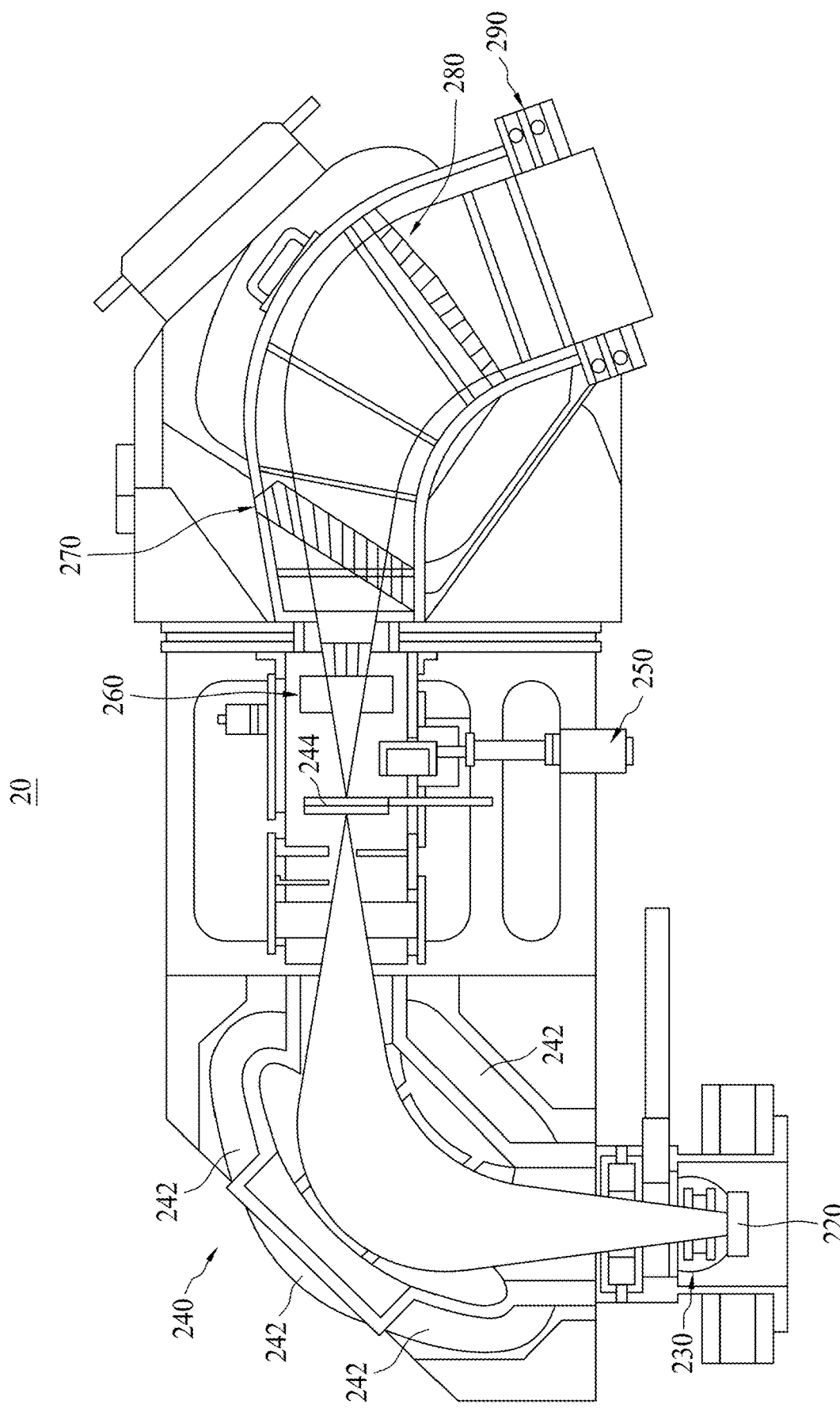
FIG. 3 is a schematic diagram of an ion implant device in accordance with some embodiments of the present disclosure.
Figure 4:
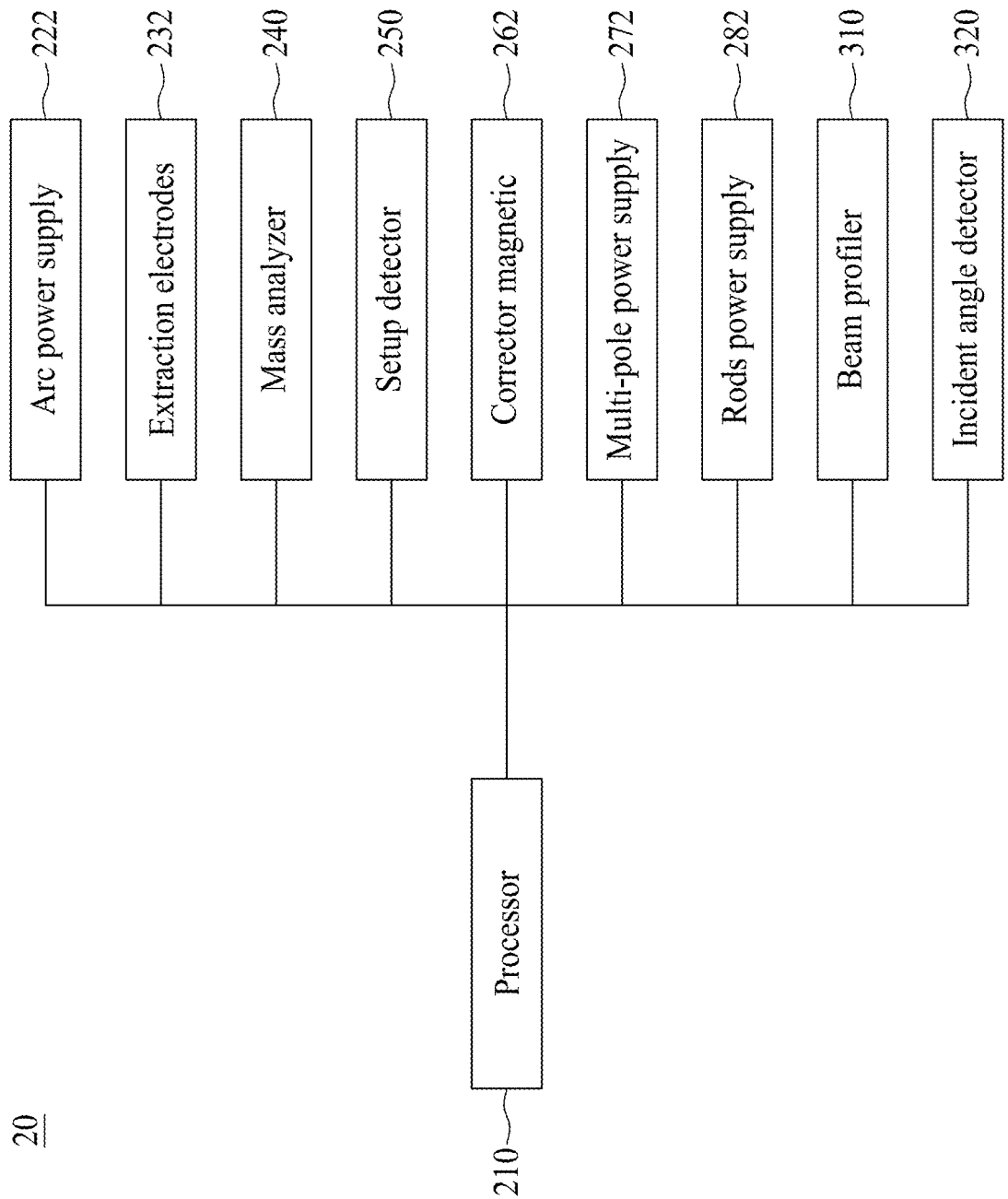
FIG. 4 is circuit block diagram of the ion implant device in accordance with some embodiments of the present disclosure.

FIG. 3 is a schematic diagram of an ion implanter 20 in accordance with some embodiments of the present disclosure. FIG. 4 is a circuit block diagram of the ion implanter 20 in accordance with some embodiments of the present disclosure. Referring to FIGS. 3 and 4, the ion implanter 20 is configured to implant ions into the substrate 100 positioned in the processing chamber 100 for ion implantation. The ion implanter 20 for implanting ions into the substrate 100 using an ion beam 200 includes processor 210, an ion source 220, a source manipulator 230, a mass analyzer 240, a setup detector 250, a beam manipulator 260, a multipole unit 270, one or more upper/lower rods 280 and a suppression assembly 290.

The processor 210 may reside in a personal computer (PC) including a memory used to store instructions for the processor 210 to execute or data for the processor 210 to operate on. The processor 210 can perform additional operations, functions, and control of the ion implanter 20 during the execution of the instructions. In alternative embodiments, the PC may further include a central processing unit (CPU) controlling and coordinating operations of the PC.

The ion beam 200 generated by the ion source 220 and the source manipulator 230 is directed to the mass analyzer 240 employed to select ions of desired species for implantation, and the setup detector 250 is configured to measure properties of the ion beam 200, wherein the setup detector 250 is operatively coupled to the processor 210, which is operable to determine whether one or more characteristics of the ion beam 200 are satisfactory for ion implantation.

Specifically, the ion source 220 functions to ionize an ionizable dopant gas, such as $BF_3$, $BCl_3$, $PH_3$, $AsH_3$, containing the ion species to be implanted, for example, boron (B), phosphorus (P), or arsenic (As). Energy generated by an arc power supply 222 is imparted to the ionizable dopant gas to generated ions within the ion source 220. In some embodiments, the gas is ionized mainly by the bombardment of the atoms or molecules with electrons from arc discharge collisions.

Ions generated within the ion source 220 are extracted by the source manipulator 230 to form the ion beam 200, wherein the ion beam 200 is a mixture of different portions of molecules and atoms of the ionizable dopant gas. The source manipulator 230 can include one or more extraction electrodes 232 operable to accelerate and extract positive ions out of the ion source 220. In some embodiments, the extraction electrodes 232, electrically coupled to the processor 210, are grounded to extract the positive ions out of the ion source 220.

When high purity is required, the ion beam 200 is directed through the mass analyzer 240, electrically coupled to the processor 210, to determine the species to be implanted. In addition, the mass analyzer 240 may focus the ions beam 200 in both dimensions, deflect it, and is arranged so that the ion beam 200 passes cleanly through a resolving aperture 244. In some embodiments, the mass analyzer 240 can include a plurality of magnets 242, such as electromagnetics, that provide a magnetic field across the ion beam 200, thereby deflecting ions from the ion beam 200 at varying trajectories according to a charge-to-mass ratio of the ions. The magnets 242 perform mass analysis and angle correction/adjustment on the ion beam 200. The resolving aperture 244 is used to reject unwanted components in the ion beam 200. Specifically, the ion beam 200 approaching the mass analyzer 240 has a specific energy in terms of its momentum and, since each ion species has a different mass, the momentum of all ions included within the ion beam 200, including the undesired beams, have particular values of momentum. By adjusting the magnetic field intensity of the magnets 242, positioned along the beam path, only those desired ions having a particular momentum can pass through the mass analyzer 240 and exit through the resolving aperture 24. The mass analyzer 240 is operatively coupled to the processor 210, which is operable to control the strength (and orientation) of the magnetic field of the mass analyzer 240.

The setup detector 250 is configured to measure physical parameters of the ion beam 200 having desired ions. The setup detector 250 of a movable measurement type can be retreated between a beam scan position and a retreated position. Specifically, the setup detector 250 measures the physical parameters at the beam scan position while moving from the retreated position in the vertical direction to be orthogonal to the ion beam 200 and immediately behind the resolving aperture 244. The setup detector 250 is retreated from the beam scan position after measurement. The setup detector 250 is further configured to generate an implantation profile based on the measured physical parameters, including one or more of a current of the ion beam 200 (i.e., the beam current) and a spot size of the ion beam 200.

The beam manipulator 260 accepts the ion beam 200 leaving the resolving aperture 244 and is used to manipulate a shape of the ion beam 200. The beam manipulator 260 may manipulate the shape of the ion beam 200 using an electrical field generated by a plurality of corrector magnetics 262 extending across the beam path to tailor a precise one-dimensional beam current distribution which yields a uniform implantation dose. In some embodiments, the corrector magnetics 262 may be electromagnetics electrically coupled to the processor 210. The multipole unit 270 and the upper/lower rods 280 accepts the divergent ion beam 200 leaving the beam manipulator 260, and deflect and renders it parallel in both dimensions. In some embodiments, the multipole unit 270 and the upper/lower rods 280 may deflect the ion beam 200 by electricity provided by a multi-pole power supply 272 and a rods power supply 282. By adjusting the electricity supplied to the multipole unit 270 and the upper/lower rods 280 using the processor 210, the ion beam 100 can be directed to the processing chamber 110. The suppression assembly 290 focuses the ion beam 200 to reduce angular divergence and space size.

Referring again to FIGS. 1 and 4, the ion implanter 20 may further includes an incident angle detector 310 and a beam profiler 320 disposed in the processing chamber 110 and electrically coupled to the processor 210. The incident angle detector 310 may be located behind an implant plane 112 that supports the substrate 100 to measure the incident angle of the ion beam 200. The beam profiler 310 is located near an implant plane 112 and configured to measure an implant current of the ion beam 200 in the vicinity of the implant plane 112.

The processor 210 may control an electricity supply by the arc power supply 222 of the ion source 220 to control the power for ionizing the feed gas. The processor 210 is connected to the extraction electrodes 232 of the source manipulator 230 and the magnetic analyzer 240 to control the magnetic field applied to the ions, thereby selecting the ions for inclusion into the ion beam 200. The processor 210 is electrically connected to the corrector magmatic 262, the multi-pole power supply 272 and the rods power supply 282 to control the divergent and incident angle of the ion beam 200 at the implant plane 102.

In general, an initial script including a plurality of implantation parameters for setting the ion implanter 20 is created by on-site technicians. The implantation parameters may be manually input into the implanter 20 from operation interface communication links the processor 210. The ion beam 200 generated using the initial script manually provided by the on-site technicians may have an initial implantation profile, wherein the initial implantation profile may be derived from measurement results provided by the setup detector 250, the beam profiler 320 and/or the incident angle detector 310.

The processor 210 is configured to perform respective data analytics to determine whether the initial implantation profile match with a desired implantation profile. If the initial implantation profile matches with the desired implantation profile, an implanting process can be performed for implanting ions into the substrate 100. In addition, the processor 210 may set the initial script as a model scrip for implantation once the initial implantation profile matches with the desired implantation profile. In some embodiments, the processor 210 may learn on the model script.

If, on the other hand, the initial implantation profile does not match the desired implantation profile, the processor 210 is operable to tune the implantation parameters to assure desirable dose and uniformity of the implantation. In particular, the processor 210 can automatically and intelligently tune the implantation parameters based on the initial implantation profile and the desired implantation profile to generate an adjusted script. Subsequently, the processor 210 is configured to determine whether the implantation parameters of the adjusted script are qualified. Specifically, the processor 210 may control the implanter 20 to generate the ion beam 200 using the adjusted script, and determined whether an adjusted implantation profile of the ion beam generated using the adjusted script matches with the desired implantation profile. If the adjusted implantation profile does not match with the desired implantation profile, the processor 210 requires the on-site technicians to create another initial script.

If, on the other hand, the adjusted implantation profile matches with the desired implantation profile, the implantation parameters of the adjusted script are qualified, and an implanting process can be performed for implanting ions into the substrate 100. In some embodiments, the processor 210 may store the qualified updated scrip in a database 30, as shown in FIGS. 5A through 5D. In addition, the processor may store the model script in the database 30.

Figure 5A:
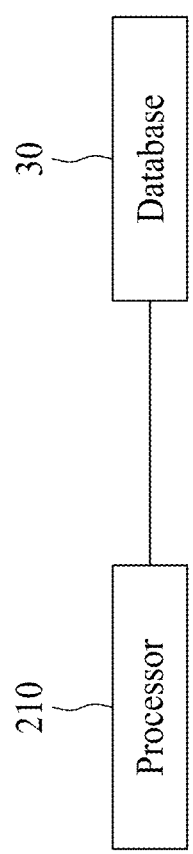

Referring to FIG. 5A, the processor 210 is designated exclusively for performing operations to control the implantation parameters. In some embodiments, the processor 210 is communicatively connected to the database 30 through a hard-wire connection. In other words, the processor 210 of the ion implanter 20 can implement physical control activities to control operations of the ion implanter 20, thereby tuning the ion beam 200 provided by the ion implanter 20. It should be noted that the database 30 may be any desired type of data collector having a desired type of memory and any desired software, hardware, or firmware for storing data. Although illustrated as a separate device, the database 30 may alternatively be a part of the processor 210.

Referring to FIG. 5B, in some embodiments, a wireless communication is established between the processor 210, configured to control the processing parameters for implantation, and the database 30, using any desired wireless communication equipment, including hardware, software, firmware, or any combination thereof. The processor 210 shown in FIGS. 5A and 5B is configured to perform respective data analytics and/or learning on the model and adjusted scripts stored in the database 30. The execution of the analytics and/or learning may be performed in response to a command or instruction generated by on-site technicians. Additionally or alternatively, the execution of the analytics and/or learning may be performed in an automatic and/or autonomous manner without using any input from the on-site technicians to initiate the learning analysis. That is, the processor 210 shown in FIGS. 5A and 5B dominates the tuning of the ion beam 200 in the ion implanter 20.

Figure 5C:
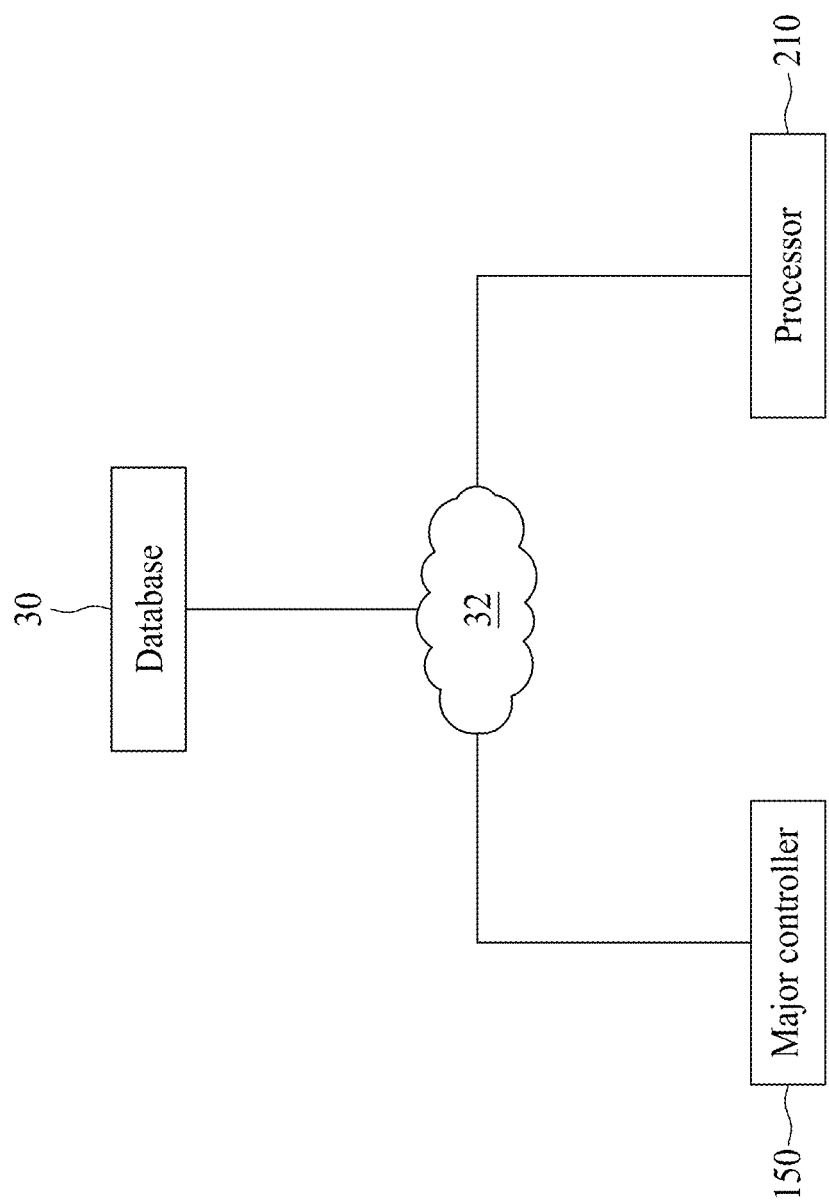

Referring to FIG. 5C in some embodiments, the database 30 is a virtual database, and the controller 150 and the processor 210 are connected to the database 30 through a network 32. Consequently, information can be delivered and exchanged between the major and controllers 150 and processor 210 through the network 32.

Referring to FIG. 5D, in some embodiments, the controller 150 is communicatively connected to the processor 210 and the database 30 using a hardwired communication scheme. The processor 210 may access the database 30 through the controller 150. The controller 150 shown in FIGS. 5C and 5D can be configured to perform respective data analytics and/or learning on the model and adjusted scripts stored in the database 30, and the processor 210 can execute commands to control the process parameters in response to messages sent from the controller 150 through a hard-wire connection or a wireless coupling. That is, the controller 150 shown in FIGS. 5C and 5D dominates the tuning of the ion beam 200 in the ion implanter 20.

In some embodiments, the model script stored in the database 30 are manually built and uploaded to the database 30 by on-site technicians. In some embodiments, the adjusted script can be automatically generated by the processor 210 by using the existing model script. In other words, through the learning, training and evaluation of the neural network, the processor 210 can automatically and intelligently generate the adjusted script. After the generation is complete, the corresponding script is automatically built in the database 30. In some embodiments, the model and adjusted scripts may include parameters for controlling the implanter 20 to generate the ion beam 200 having a specific beam current, a specific spot size, and/or a specific dosage of ions for an implantation.

Figure 6:
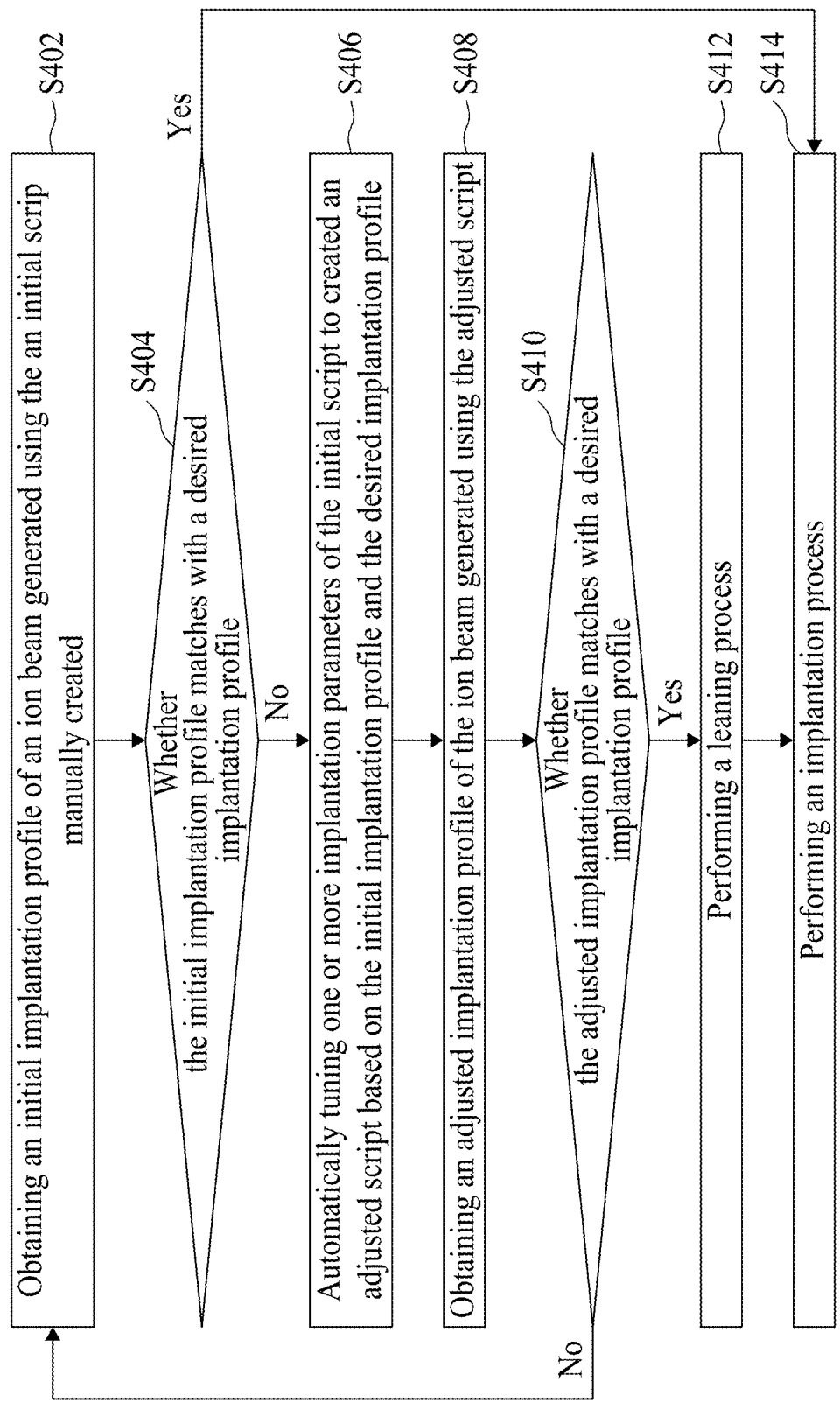
FIG. 6 is a flowchart of a method for operating an ion implanter in accordance with some embodiments of the present disclosure.

FIG. 6 is a flowchart of a method 400 for operating an ion implanter in accordance with some embodiments of the present disclosure. The method 400 can be considered an ion beam tuning method for the ion implanter, and includes a step S402 of obtaining an initial implantation profile of an ion beam generated by the ion implanter using an initial script manually created; a step S404 of determining whether the initial implantation profile matches a desired implantation profile; a step S406 of tuning one or more implantation parameters based on the initial implantation profile and the desired implantation profile if the initial implantation profile does not match the desired implantation profile; a step S408 determining whether an adjusted initial implantation profile of the ion beam generated using the adjusted script matches with a desired implantation profile; a step S410 of performed an leaning process if the adjusted script matches with a desired implantation profile; a step 412 of performing a learning process; and a step S404 of performing an implantation process.

In some embodiments, the initial script including a plurality of implantation parameters is generated and input to the implanter 20 by on-site technicians. In some embodiments, after the determination step S404, if the initial implantation profile matches the desired implantation profile, the implanter 20 performs the implantation process to implant ions into a substrate. The parameters that can be used in determination including parameters indicative of a beam current, an incident angle and/or a spot size of the ion beam.

In conclusion, with the configuration of the substrate-processing apparatus, the ion beam generated by the implanter can be automatically tuned based on the initial implantation profile and a plurality of model scripts, and additional scripts can be automatically built, so as to increase the accuracy of implantation.

One aspect of the present disclosure provides a substrate-processing apparatus. The substrate-processing apparatus comprises an ion implanter and a controller. The ion implanter is configured to implant ions into a substrate using an ion beam. The controller is associated with the ion implanter and configured to monitor an initial implantation profile of the ion beam and tune the ion implanter to provide the ion beam having a desired implantation profile based on the initial implantation profile and a plurality of model scripts.

One aspect of the present disclosure provides a method of tuning an ion beam in an ion implanter. The method comprises steps of obtaining an initial implantation profile of the ion beam; and tuning the ion implanter to provide the ion beam having a desired implantation profile based on the initial implantation profile and a plurality of model scripts.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A substrate-processing apparatus, comprising:
   an ion implanter for implanting ions into a substrate using an ion beam; and
   a processor associated with the ion implanter and configured to monitor an initial implantation profile of the ion beam and automatically tune the ion implanter to provide the ion beam having a desired implantation profile based on the initial implantation profile and the desired implantation profile;
   wherein the processor derives the initial implantation profile based on properties measured by a setup detector, a beam profiler and an incident angle detector of the ion implanter.

2. The substrate-processing apparatus of claim 1, wherein a plurality of implantation parameters for generating the ion beam having the initial implantation profile is manually created.

3. The substrate-processing apparatus of claim 1, wherein the processor is further configured to build a model script corresponding to the desired implantation profile.

4. The substrate-processing apparatus of claim 3, further comprising a database associated with the processor for storing the model scrip.

5. The substrate-processing apparatus of claim 4, wherein the processor is associated with the ion implanter through a hard-wire connection or a wireless coupling.

6. The substrate-processing apparatus of claim 1, wherein the processor is further configured to determine whether a match exists between the desired implantation profile and at least one model script and tune the ion implanter in accordance with the model script matching the desired implantation profile.

7. The substrate-processing apparatus of claim 1, wherein the ion implanter comprises:
   an ion source energized by the processor and functioning to ionize a gas;
   a source manipulator extracting ions generated within the ion source to form the ion beam;
   a mass analyzer providing a magnetic field to select ions of desired species for implantation;
   a beam manipulator accepting the ion beam leaving the mass analyzer and used to manipulate a shape of the ion beam by a magnetic field; and
   a multipole unit and upper/lower rods to direct desired ions to the substrate using electricity;
   wherein the processor tunes the ion implanter to generate the ion beam by adjusting at least one of a potential applied to the ion source, the multipole unit and the upper/lower rods and the magnetic field of the mass analyzer and the beam manipulator.

8. The substrate-processing apparatus of claim 7, wherein the mass analyzer further comprises a resolving aperture to filter unwanted species.

9. The substrate-processing apparatus of claim 8, wherein the initial implantation profile and the desired implantation profile comprise at least one of a beam current leaving the resolving aperture, an implanting current and an incident angle of the ion beam near an implant plane that supports a substrate.

10. The substrate-processing apparatus of claim 9, wherein the beam current is detected by the setup detector, the implanting current is tracked by the beam profiler and the incident angle of the ion beam is scanned by the incident angle detector.

11. A method of tuning an ion beam in an ion implanter, the method comprising:
   obtaining an initial implantation profile of the ion beam generated using an initial script;
   determining whether the initial implantation profile matches with a desired implantation profile;
   automatically generating an updated script based on the initial implantation profile and the desired implantation profile if the initial implantation profile does not match with a desired implantation profile;
   determining whether an adjusted implantation profile of the ion beam generated using the adjusted script matches with the desired implantation profile; and
   performing an implantation process to implant ion to a substrate if the adjusted script matches with the desired implantation profile;
   deriving the initial implantation profile based on properties measured by a setup detector, a beam profiler and an incident angle detector of the ion implanter.

12. The method of claim 11, further comprising building a model script corresponding to the desired implantation profile.

13. The method of claim 12, wherein the initial script for generating the ion beam having the initial implantation profile is manually created.

14. The method of claim 12, wherein the ion beam having the desired implantation profile is provided by executing one of the initial scripts.

\* \* \* \* \*